US008194472B2

(12) United States Patent
Sato

(10) Patent No.: US 8,194,472 B2
(45) Date of Patent: *Jun. 5, 2012

(54) SEMICONDUCTOR MEMORY DEVICE

(75) Inventor: Jumpei Sato, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/044,657

(22) Filed: Mar. 10, 2011

(65) Prior Publication Data
US 2011/0158006 A1 Jun. 30, 2011

Related U.S. Application Data

(63) Continuation of application No. 12/128,324, filed on May 28, 2008, now Pat. No. 7,924,632.

(30) Foreign Application Priority Data

May 29, 2007 (JP) ................................ 2007-141538

(51) Int. Cl.
*G11C 7/10* (2006.01)
(52) U.S. Cl. ......... 365/189.06; 365/185.17; 365/185.05; 365/185.21; 365/185.25; 365/185.11
(58) Field of Classification Search ............ 365/189.06, 365/185.17, 185.05, 185.21, 185.25, 185.11
See application file for complete search history.

(56) References Cited

U.S. PATENT DOCUMENTS

| 4,970,691 | A | 11/1990 | Atsumi et al. |
| 5,022,010 | A * | 6/1991 | Chan .................. 365/230.06 |
| 5,161,121 | A | 11/1992 | Cho |
| 5,239,507 | A * | 8/1993 | Ohba .................. 365/189.06 |
| 5,267,197 | A | 11/1993 | McClure |
| 5,317,212 | A | 5/1994 | Wahlstrom |
| 5,434,815 | A | 7/1995 | Smarandoiu et al. |
| 5,572,474 | A | 11/1996 | Sheen et al. |
| 5,719,811 | A * | 2/1998 | Kondou .............. 365/189.06 |
| 5,835,419 | A | 11/1998 | Ichimura et al. |
| 5,933,373 | A * | 8/1999 | Takahashi .......... 365/189.06 |
| 6,031,779 | A * | 2/2000 | Takahashi et al. ...... 365/226 |
| 6,201,731 | B1 | 3/2001 | Kamp et al. |
| 6,301,173 | B2 | 10/2001 | Fujioka et al. |
| 6,724,245 | B2 * | 4/2004 | Kwon et al. ................ 327/589 |
| 6,835,599 | B2 * | 12/2004 | Kuan et al. ................. 438/111 |

(Continued)

FOREIGN PATENT DOCUMENTS
JP   2005-327409   11/2005
(Continued)

*Primary Examiner* — Viet Q Nguyen
(74) *Attorney, Agent, or Firm* — Oblon, Spivak, McClelland, Maier & Neustadt, L.L.P.

(57) ABSTRACT

A semiconductor memory device comprising: a memory cell array having a plurality of memory cells that are arranged in a shape of a matrix along a plurality of bit lines arranged in parallel and a plurality of word lines intersecting orthogonally to the bit lines, and that have their data read out to the bit lines; a sense amplifier which detects a voltage or a current of the bit line, and which decides the read data from each of the memory cells; a clamping transistor which is connected between the sense amplifier and the bit lines, and which determines a voltage in a charging mode of the bit lines by a clamp voltage applied to a gate thereof; and a clamp voltage generation circuit which generates the clamp voltage so as to become larger as a distance from the sense amplifier to a selected one of the memory cells is longer.

11 Claims, 8 Drawing Sheets

U.S. PATENT DOCUMENTS

| | | |
|---|---|---|
| 6,842,377 B2 * | 1/2005 | Takano et al. ............ 365/185.21 |
| 6,928,006 B2 | 8/2005 | Park |
| 6,950,326 B2 | 9/2005 | Suzuki |
| 7,009,881 B2 | 3/2006 | Noguchi |
| 7,082,061 B2 * | 7/2006 | Chou et al. ............... 365/189.06 |
| 7,170,784 B2 | 1/2007 | Cernea et al. |
| 7,173,854 B2 * | 2/2007 | Cernea et al. ............ 365/185.12 |
| 7,260,004 B2 * | 8/2007 | Lamorey et al. .............. 365/201 |
| 7,468,914 B2 | 12/2008 | Toda |
| 7,471,588 B2 | 12/2008 | Yu et al. |
| 7,596,035 B2 * | 9/2009 | Doyle et al. ............. 365/189.06 |
| 7,633,100 B2 * | 12/2009 | Cho et al. ...................... 257/256 |
| 7,924,632 B2 * | 4/2011 | Sato ......................... 365/189.06 |
| 2001/0035548 A1 * | 11/2001 | Wahlstrom ..................... 257/296 |
| 2003/0048684 A1 * | 3/2003 | Tanzawa et al. ............. 365/226 |
| 2006/0034140 A1 | 2/2006 | Ogawa et al. |

FOREIGN PATENT DOCUMENTS

| | | |
|---|---|---|
| JP | 2006-79803 | 3/2006 |

* cited by examiner

| SELECTED BLOCK | AROW3 | AROW2 | AROW1 | AROW0 |
|---|---|---|---|---|
| Block0 | 1 | 1 | 1 | 1 |
| Block1 | 1 | 1 | 1 | 0 |
| Block2 | 1 | 1 | 0 | 1 |
| Block3 | 1 | 1 | 0 | 0 |
| Block4 | 1 | 0 | 1 | 1 |
| Block5 | 1 | 0 | 1 | 0 |
| Block6 | 1 | 0 | 0 | 1 |
| Block7 | 1 | 0 | 0 | 0 |
| Block8 | 0 | 1 | 1 | 1 |
| Block9 | 0 | 1 | 1 | 0 |
| Block10 | 0 | 1 | 0 | 1 |
| Block11 | 0 | 1 | 0 | 0 |
| Block12 | 0 | 0 | 1 | 1 |
| Block13 | 0 | 0 | 1 | 0 |
| Block14 | 0 | 0 | 0 | 1 |
| Block15 | 0 | 0 | 0 | 0 |

Fig.7

SEMICONDUCTOR MEMORY DEVICE

CROSS-REFERENCE TO RELATED APPLICATIONS

This application is a continuation of and claims the benefit of priority under 35 U.S.C. §120 from U.S. Ser. No. 12/128,324 filed May 28, 2008, now U.S. Pat. No. 7,924,632 and claims the benefit of priority under 35 U.S.C. §119 from Japanese Patent Application No. P2007-141538 filed May 29, 2007, the entire contents of each of which are incorporated herein by reference.

BACKGROUND OF THE INVENTION

1. Field of the Invention

The present invention relates to semiconductor memory devices such as NAND cell, NOR cell, DINOR (Divided bit line NOR) cell and AND cell type EEPROMs, and more particularly to a semiconductor memory device in which a detection precision in a sense amplifier can be enhanced.

2. Description of the Related Art

The sense amplifier of a flash memory or the like semiconductor memory device decides the value of data basically by detecting the existence or nonexistence or the magnitude of a cell current which flows in accordance with the data of a memory cell. This sense amplifier is usually connected to bit lines (data lines) to which a large number of memory cells are connected, and the sensing schemes thereof are broadly classified into a voltage detection type and a current detection type.

With the voltage detection type sense amplifier, by way of example, the bit lines in states where they are separated from the memory cells are precharged to a predetermined voltage, the bit line is thereafter discharged by the selected memory cell, and the discharge state of the bit line is detected at a sense node joined to the bit line. In sensing the data, the bit line is separated from a current source load, and a bit-line voltage determined by the cell data is detected. This sense amplifier scheme is usually employed in a NAND type flash memory.

On the other hand, the current detection type sense amplifier senses the data by causing a read current to flow to the memory cell through the bit line. Also in this case, however, the bit-line voltage is determined by the cell data, and the data decision at the sense node joined to the bit line, finally detects the difference of the voltage based on the difference of the cell current.

In general, the voltage detection type sense amplifier and the current detection type sense amplifier have merits and demerits as stated below. The voltage detection type utilizes the charging and discharging of the bit lines, and hence, power consumption may be low. In a large-capacity memory of large bit-line capacitances, however, a long time is expended on the charging and discharging, and hence, high-speed sensing becomes difficult. Besides, the bit-line voltage is oscillated comparatively largely in accordance with the cell data, so that the noise between the adjacent bit lines becomes a problem.

On the other hand, the current detection type sense amplifier is capable of the high-speed sensing in such a way that the data is sensed while causing the read current to flow to the memory cell through the bit line. Besides, the amplitude of the bit-line voltage corresponding to the cell data can be suppressed to a small one by a clamping transistor (pre-sense amplifier) arranged between the bit line and the sense node, so that the noise between the bit lines is difficult to become problematic. In the current detection type sense amplifier, however, the power consumption enlarges more than in the voltage detection type sense amplifier to the extent that the data is sensed while the current is kept flowing.

In the NAND type flash memory of the enlarged capacity, the voltage detection type sense amplifier has heretofore been extensively employed. However, in a case where the capacity of the memory is enlarged more, how the high-speed sensing is performed with the power consumption suppressed becomes an important problem to-be-solved. Further, when the microfabrication and capacity enlargement of the memory are advanced, the dispersion of currents attributed to the resistance values of the bit lines becomes a problem.

More specifically, in the NAND type flash memory, a read voltage Vcg which turns ON or OFF the selected cell in accordance with the content of the data is applied to the control gate of the selected cell from which the data is read out, among the plurality of NAND-connected memory cells. Also, a path voltage Vread which turns ON the other unselected cells irrespective of the contents of the data is applied to the control gates of the unselected cells. Thus, the content of the data of the selected cell is decided, depending upon if the current flows to the bit line through the memory cells. The voltage of the bit line is determined by a voltage Vclamp which is fed to the gate of the bit-line clamping transistor interposed between the sense amplifier and the bit line, and a voltage (Vclamp−Vthn) (where "Vthn" indicates the threshold voltage of the clamping transistor) is charged to the bit line. Since each cell operates in a linear region, the cell current tends to depend upon the drain-source voltage Vds of the selected cell. The voltage of the drain side of the selected cell is determined by the voltage of the bit line, the resistance value of the bit line, and the resistance values of the unselected cells nearer to the bit line than the selected cell, within a memory cell array, while the voltage of the source side of the selected cell is determined by the float of a source line (SRC), and the resistance values of the unselected cells nearer to the source line SRC than the selected cell, within the memory cell array. In this regard, there has also been proposed a technique for decreasing the cell current in such a way that the path voltage Vread which is fed to the unselected cells between the selected cell and the source line is controlled in accordance with the number of the unselected cells.

When the microfabrication and capacity enlargement of the memory are further advanced in the future, it is expected that the resistance value of the bit line will increase more and more. When the resistance value of the bit line increases, a dispersion occurs in the voltage of the drain side of the selected cell between in a case where the memory cell nearer to the sense amplifier has been selected and in a case where the memory cell remoter from the sense amplifier has been selected, and the dispersion of the voltage incurs the dispersion of the cell current. That is, in the case where the selected cell is remoter from the sense amplifier, a voltage drop IR-DROP ascribable to the bit-line resistance appears, and the voltage Vds of the selected cell decreases. As a result, the cell current becomes small. In the worst case, there is the problem that the read data will be erroneously decided.

BRIEF SUMMARY OF THE INVENTION

A semiconductor memory device comprising: a memory cell array which includes a plurality of memory cells that are arranged in a shape of a matrix along a plurality of bit lines arranged in parallel and a plurality of word lines intersecting orthogonally to the bit lines, and that have their data read out to the bit lines; a sense amplifier which detects a voltage or a current of the bit line, and which decides the read data from each of the memory cells; a clamping transistor which is connected between the sense amplifier and the bit lines, and which determines a voltage in a charging mode of the bit lines by a clamp voltage applied to a gate thereof; and a clamp voltage generation circuit which generates the clamp voltage so as to become larger as a distance from the sense amplifier to a selected one of the memory cells is longer.

BRIEF DESCRIPTION OF THE SEVERAL VIEWS OF THE DRAWINGS

FIG. 7 is a diagram showing the relations between addresses inputted to the Vclamp generation circuit and selected blocks.

DETAILED DESCRIPTION OF THE INVENTION

First Embodiment

Figure 1:
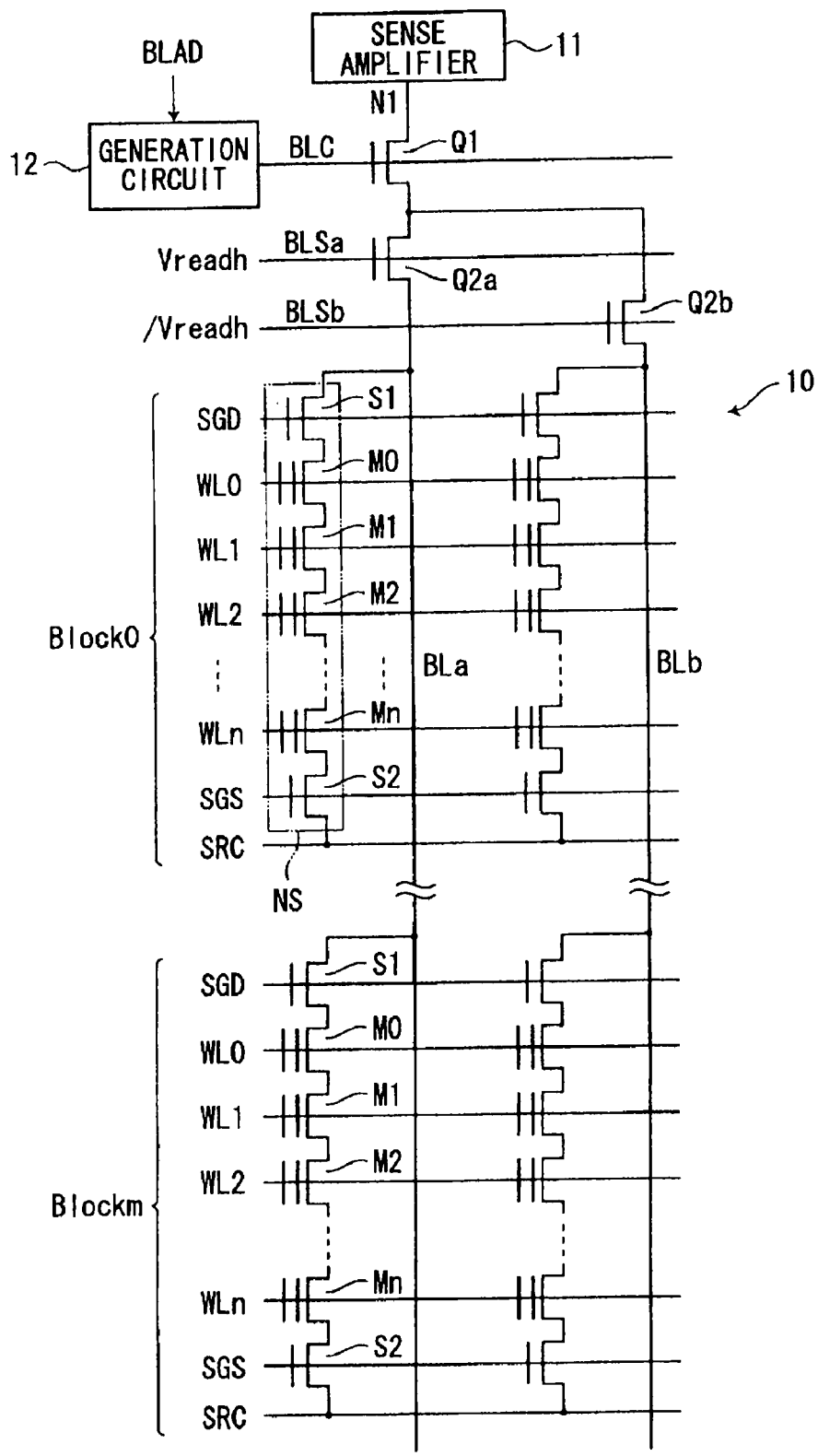
FIG. 1 is a circuit diagram of the essential portions of a NAND type flash memory according to the first embodiment of the present invention.

FIG. 1 is a circuit diagram of the essential portions of a NAND type flash memory according to the first embodiment of the present invention. A memory cell array 10 is configured in such a way that bit lines BL are formed in a vertical line in the figure, while word lines WL are formed in a lateral direction, and that a plurality of NAND strings NS are arranged in the shape of a matrix along the bit lines BL and the word lines WL. Each of the NAND strings NS is configured including a memory cell array in which a plurality of memory cells M0-Mn are connected in series in such a shape that impurity regions (sources/drains) are shared by the adjacent ones of the memory cells, and a first selection gate transistor S1 and a second selection gate transistor S2 which are respectively connected at both the ends of the memory cell array. Each of the memory cells M0-Mn is made of a MOSFET in which a floating gate (charge accumulation layer) and a control gate (CG) are stacked through an insulating film on a semiconductor substrate serving as a channel region. The drain of the first selection gate transistor S1 is connected to the bit line BL extending in parallel with the arrayal direction of the memory cells M0-Mn, and the source of the second selection gate transistor S2 is connected to a source line SRC. The control gate of each of the memory cells M0-Mn constitutes the word line WL intersecting orthogonally to the bit line BL, and the gates of the selection gate transistors S1 and S2 constitute selection gates SGD and SGS intersecting orthogonally to the bit line BL. The plurality of NAND strings NS which are arranged in the shape of arrays in this manner, are grouped in such a manner that one block is formed by the NAND strings juxtaposed in the direction of the word lines WL. That is, the memory cell array 10 is divided into m blocks (Block0-Blockm) in the direction of the bit lines $\overline{BL}$.

A sense amplifier 11 detects the magnitude of a current flowing through the bit line BL to the selected memory cell Mi, from the voltage of a sense node N1, so as to decide the read data of the selected memory cell Mi. Either a current detection type or a voltage detection type may be employed as the sense amplifier 11. In order to reduce bit-line capacitance coupling noise, the sense amplifier 11 is shared by the adjacent two bit lines BLa and BLb. The sense node N1 of the sense amplifier 11 is connected to the bit line BLa through a clamping transistor Q1 and a bit selection transistor Q2$a$ which are connected in series, and it is connected to the bit line BLb through the clamping transistor Q1 and a bit selection transistor Q2$b$ which are connected in series. The clamping transistor Q1 is a transistor which determines a potential in the charging mode of the bit lines BLa and BLb, and it affords a voltage which is obtained by subtracting the threshold voltage Vthn of the transistor Q1 from a clamp voltage Vclamp applied to its gate as a control signal BLC, to the end parts of the bit lines BLa and BLb on the sides of the sense amplifier 11. A Vclamp generation circuit 12 generates the clamp voltage Vclamp on the basis of the address signal BLAD of the block in which the selected cell is included, and it feeds the generated voltage to the gate of the clamping transistor Q1 as the gate control signal BLC. The bit-line selection transistors Q2$a$ and Q2$b$ are respectively fed with voltages Vreadh and /Vreadh to their gates as bit-line selection signals BLSa and BLSb, so as to connect either of the bit lines BLa and BLb to the sense amplifier 11.

Next, the operation of the data read mode of the NAND type flash memory thus configured will be explained with reference to FIGS. 2 and 3. Incidentally, FIGS. 2 and 3 show a state where the bit line BLa is selected by the bit-line selection transistor Q2$a$, and the bit line BLb and the NAND strings NS connected thereto are omitted from illustration.

Figure 2:
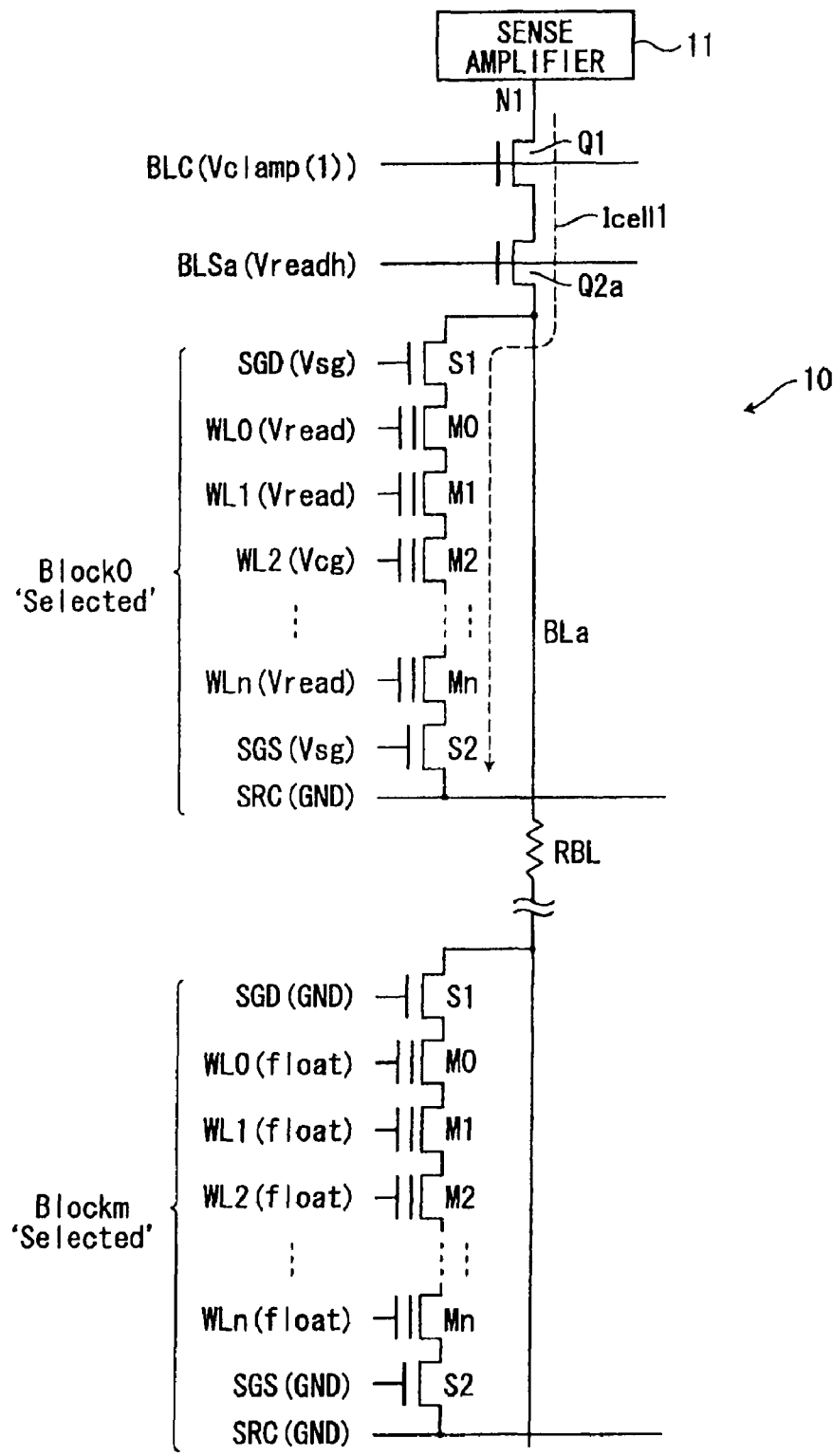
FIG. 2 is a circuit diagram for explaining the operation of the memory.
Figure 3:
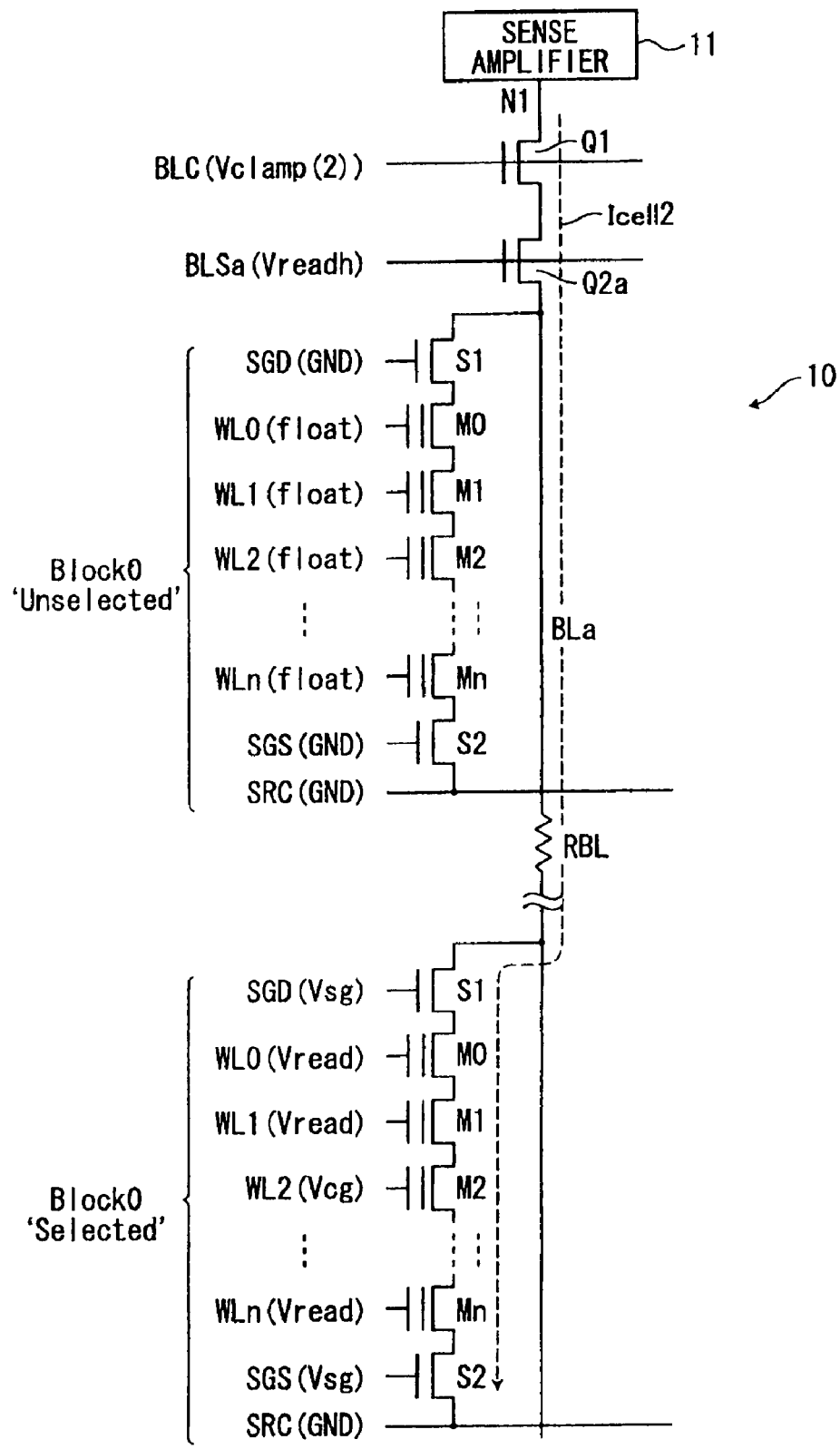
FIG. 3 is a circuit diagram for explaining the operation of the memory.

FIG. 2 shows a case where the block Block0 nearest to the sense amplifier 11 is selected, and where data is read out from the memory cell M2 corresponding to the word line WL2 in the block Block0. In this case, a clamp voltage Vclamp(1) is applied as the gate control signal BLC of the clamping transistor Q1, and hence, the bit line BLa is charged up to a voltage (Vclamp(1)–Vthn).

In the case of reading out the data from the memory cell M2 within the selected block Block0, a read voltage Vcg (for example, 0 V) which becomes ON or OFF in accordance with the stored data is applied to the control gate of the selected memory cell M2, a read voltage Vread (for example, about 4 V) which becomes ON irrespective of stored data is applied to the control gates of the other memory cells M0, M1, M3, . . . , and Mn, and a voltage Vsg (for example, about 4 V) which becomes ON is applied to the gates of the selection transistors S1 and S2. The source line SRC is set at 0 V. Besides, the control gates of the memory cells M0-Mn of the unselected blocks (Block1-Blockm) are all brought into floating states, and the selection transistors S1 and S2 are brought into OFF states.

In a case where data "0" is written in the selected memory cell M2 of the selected block Block0, the memory cell M2 exhibits a threshold voltage higher than the voltage Vcg, and hence, this memory cell M2 keeps an OFF state, so that any current does not flow through the bit line BLa, or only a slight current flows therethrough. On the other hand, in a case where data "1" is written in the selected memory cell M2, the memory cell M2 exhibits a threshold voltage lower than the voltage Vcg, and hence, this memory cell M2 turns ON, so that a large current flows through the bit line BLa. Thus, the potential of the sense node N1 lowers. Accordingly, the read data is discriminated to be "1" when the potential of the sense node N1 has lowered, and it is discriminated to be "0" when the potential of the sense node N1 has not lowered considerably.

Here, since the selected memory cell M2 operates in a linear region, a current $Icell_1$ to flow through the selected memory cell M2 is determined by the drain-source voltage Vds of the selected memory cell M2. The voltage of the drain side of the selected memory cell M2 is determined by the voltage of the bit line BLa, the resistance value of the bit line BLa, and the resistance values of the unselected cells M0 and M1 nearer to the bit line BLa than the selected memory cell M2, within the NAND string NS, while the voltage of the source side of the selected memory cell M2 is determined by the float of the source line (SRC), and the resistance values of the unselected memory cells M3-Mn nearer to the source line SRC than the selected memory cell M2, within the NAND string NS. In the case of the example in FIG. 2, the block Block0 nearest from the sense amplifier 11 is selected, and hence, a voltage drop IR-DROP hardly appears due to the resistance value in the bit line BLa. Accordingly, the drain-source voltage Vds of the selected memory cell M2 becomes a sufficiently large value. In this case, the clamp voltage Vclamp(1) may be determined so as to limit the current value $Icell_1$ in consideration of power consumption.

On the other hand, FIG. 3 shows a case where the block Blockm remotest from the sense amplifier 11 is selected, and where data is read out from the memory cell M2 corresponding to the word line WL2 within the block Blockm. In this case, a clamp voltage Vclamp(2) is applied as the gate control signal BLC of the clamping transistor Q1, and hence, the bit line BLa is charged up to a voltage (Vclamp(2)–Vthn). Incidentally, Vclamp(2)>Vclamp(1) holds here.

The operation of reading out the data of the selected memory cell M2 is the same as in the above. In the case of the example in FIG. 3, the block Blockm remotest from the sense amplifier 11 is selected, and hence, the resistance value RBL of the bit line BLa becomes the maximum. In this case, the clamp voltage Vclamp(2) is determined so that a sufficient bit-line current $Icell_2$ which does not develop erroneous read may be caused to flow. As a result, the relation of Vclamp(2)>Vclamp(1) holds.

According to this embodiment, the dispersion of that current value of the bit line which depends upon the position of the selected block can be suppressed, and the reduction of the power consumption and the prevention of the erroneous read can be attained.

Second Embodiment

Figure 4:
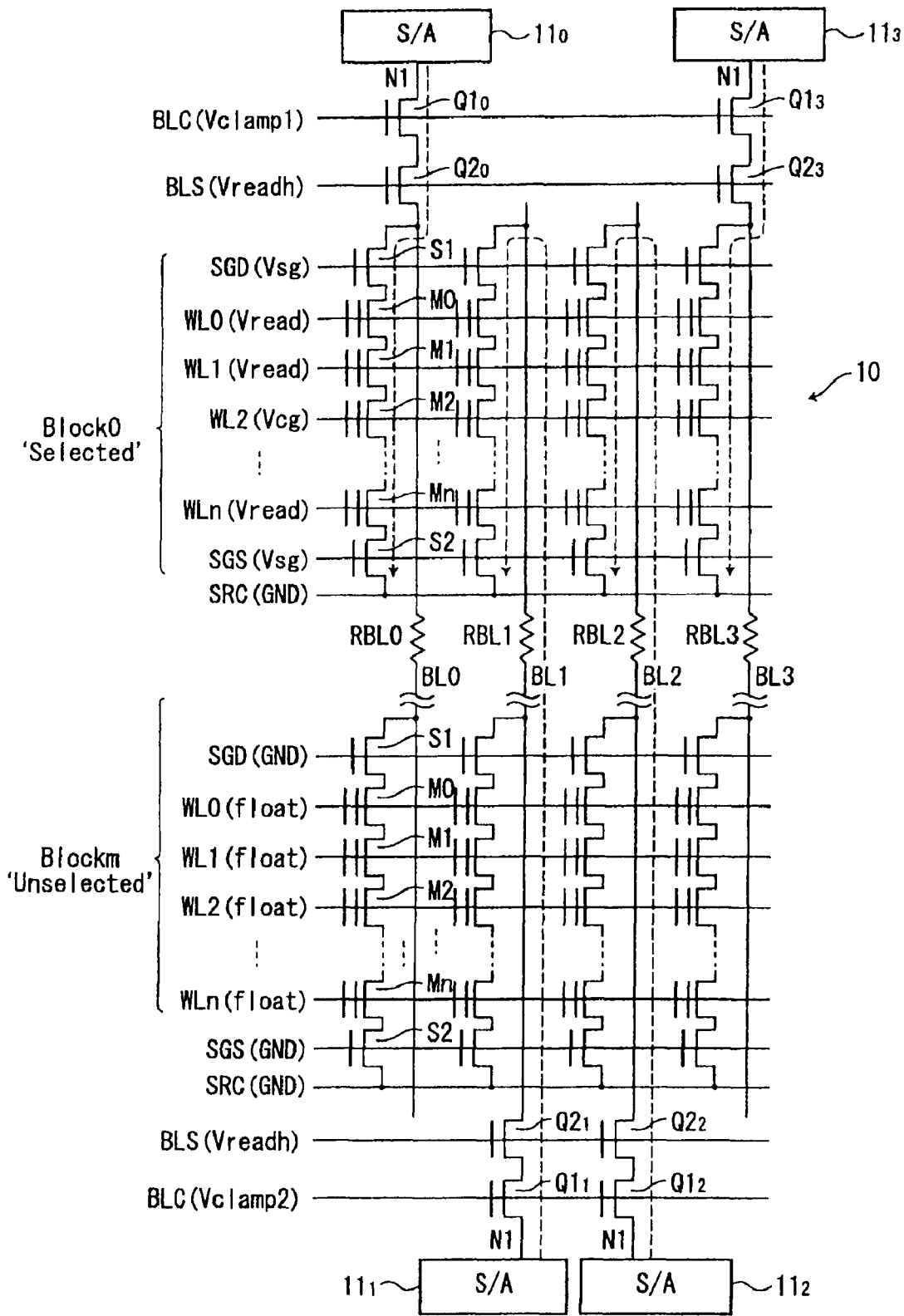
FIG. 4 is a circuit diagram of the essential portions of a NAND type flash memory according to the second embodiment of the invention.

FIG. 4 is a circuit diagram of the essential portions of a NAND type flash memory according to the second embodiment of the invention. In this embodiment, sense amplifiers $11_0$ and $11_3$ and sense amplifiers $11_1$ and $11_2$ are respectively arranged on both sides in the direction of the bit lines BL of a memory cell array 10. More specifically, the sense amplifiers $11_0$, $11_1$, . . . are alternately arranged on the upper end sides and lower end sides of the bit lines BL0, BL1, . . . as seen in the figure, every second bit line. By the way, in actuality, one sense amplifier 11 is shared by the two bit lines BL, but one of the two paired bit lines and a NAND string NU joined thereto are omitted from illustration for the brevity of explanation.

In this embodiment, clamping transistors $Q1_0$, $Q1_3$, . . . which are respectively connected between the sense amplifiers $11_0$, $11_3$, . . . on the upper end sides of the bit lines BL and the bit lines BL0, BL3, . . . are fed with a clamp voltage Vclamp1 as a gate control signal BLC, while clamping transistors $Q1_1$, $Q1_2$, . . . which are respectively connected between the sense amplifiers $11_1$, $11_2$, . . . on the lower end sides of the bit lines BL and the bit lines BL1, BL2, . . . are fed with a clamp voltage Vclamp2 as a gate control signal BLC.

According to this embodiment, in a case, for example, where data is readout from the memory cell M2 of a block Block0, the block Block0 is at the shortest distance from the sense amplifiers $11_0$, $11_3$, . . . and at the longest distance from the sense amplifiers $11_1$, $11_2$, . . . , and hence, the clamp voltages are set at Vclamp1<Vclamp2. Besides, in a case where a block (m/2) located at the middle position between the upper and lower ends of the bit lines BL has been selected, the clamp voltages are set at Vclamp1=Vclamp2, and in a case where a block Blockm located in the vicinity of the lower ends of the bit lines BL has been selected, the clamp voltages are set at Vclamp1>Vclamp2.

Figure 5:
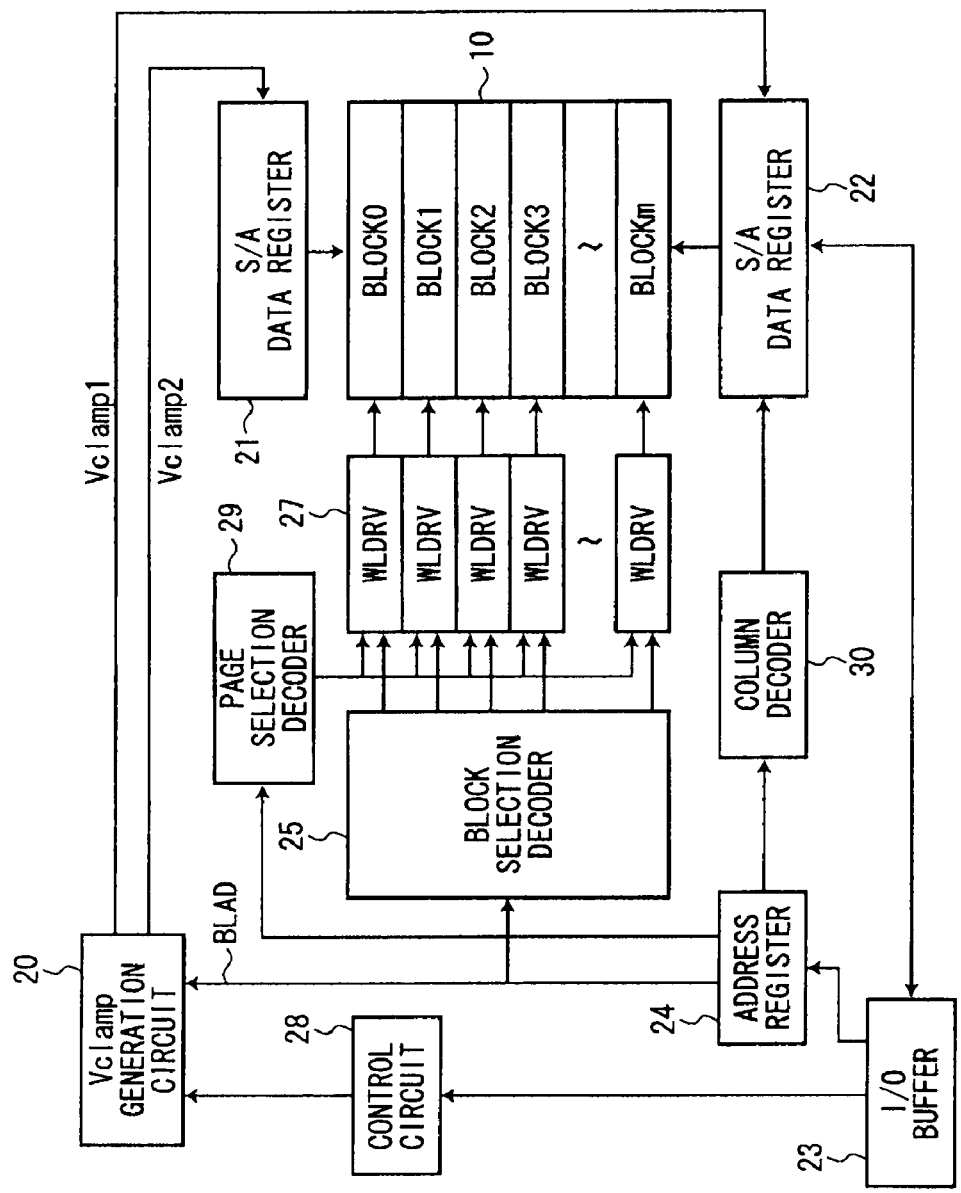
FIG. 5 is a block diagram showing the whole configuration of the memory of the second embodiment.

Thus, the dispersion of a bit-line current value which depends upon the position of the selected block can be suppressed, and the reduction of power consumption and the prevention of erroneous read can be attained. FIG. 5 is a block diagram showing the whole configuration of the NAND type flash memory according to this embodiment. Sense amplifier/data register circuits 21 and 22 are respectively arranged on both sides in the direction of the bit lines of the memory cell array 10 consisting of the blocks Block0-Blockm. The sense amplifier/data register circuits 21 and 22 include the sense amplifiers 11, the clamping transistors Q1, bit-line selection transistors Q2, and data registers. These sense amplifier/data register circuits 21 and 22 exchange data with the exterior of the flash memory through an I/O buffer 23. That address signal of the memory which is fed from the exterior is stored in an address register 24 through the I/O buffer 23. In the address signal stored in the address register 24, a block address signal BLAD consisting of high-order bits is fed to a block selection decoder 25 and also to a Vclamp generation circuit 26. The block selection decoder 25 decodes the fed block address signal BLAD, so as to activate one of $\overline{m}$ word line drivers 27. The Vclamp generation circuit 26 generates the clamp voltages Vclamp1 and Vclamp2 corresponding to the block address signal BLAD, on the basis of a control signal fed from a control circuit 28, and it feeds the generated clamp voltages to the clamping transistors to the sense amplifier/data register circuits 21 and 22. In the address signal stored in the address register 24, a further high-order address signal in a low-order address signal is fed to a page selection decoder 29, and the lower-order address signal is fed to a column decoder 30. The page selection decoder 29 activates one of the word lines WL of $\underline{n}$ memory cells M0-Mn within one block. Besides, the column decoder 30 selects the bit line BL to-be-accessed in accordance with the low-order address signal.

Figure 6:
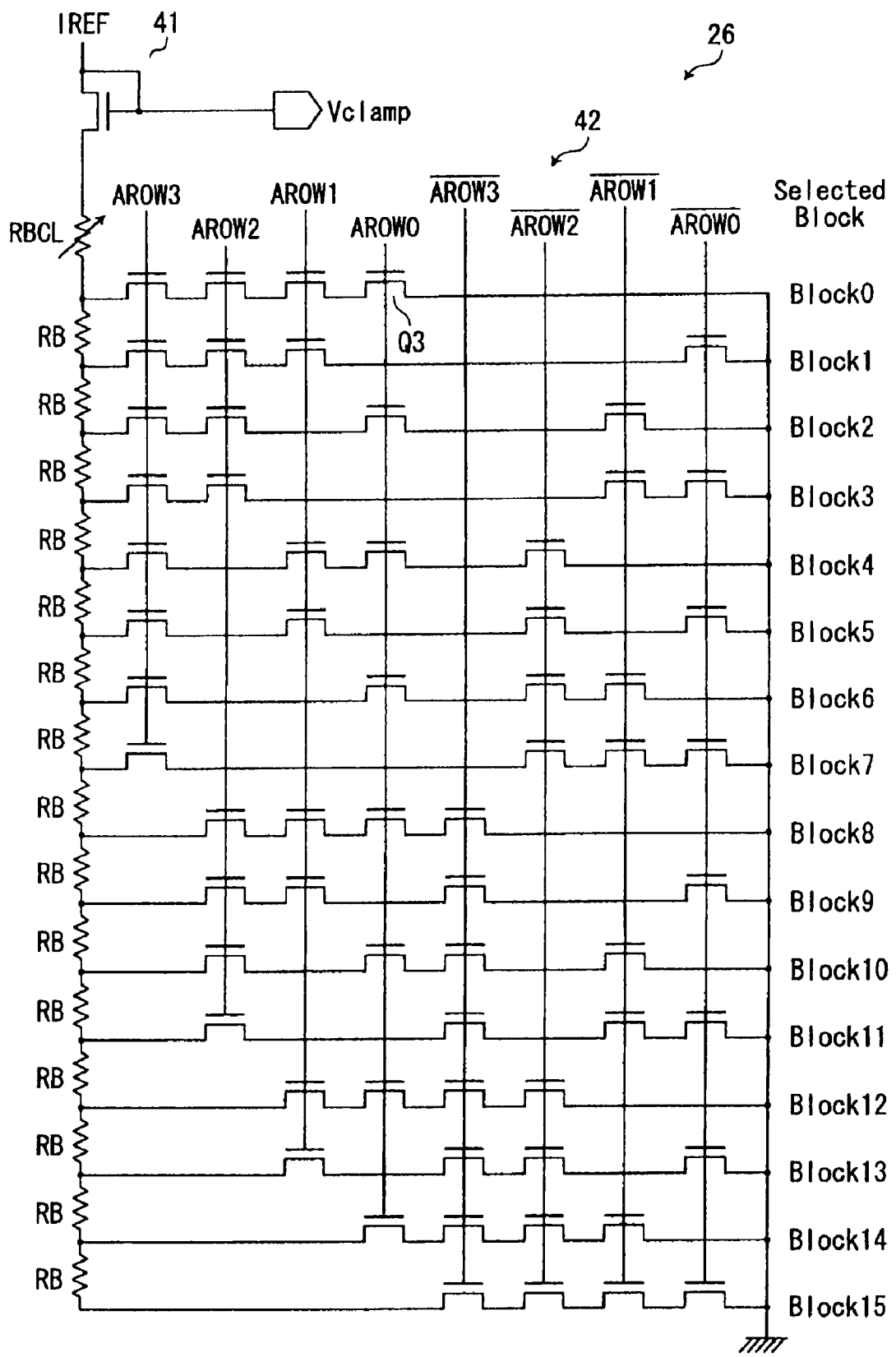
FIG. 6 is a circuit diagram of an example of a Vclamp generation circuit in the memory of the second embodiment.

FIG. 6 shows a configurational example of the Vclamp generation circuit. This example is an example in which sixteen blocks Block0-Block15 are connected to one bit line BL. Besides, FIG. 6 shows only a portion for generating the clamp voltage Vclamp1 in FIG. 5, and the clamp voltage Vclamp1 is expressed as "Vclamp".

A constant-voltage circuit 41 formed of a transistor which has its gate and its drain connected and which causes a constant current IREF to flow, outputs the gate voltage thereof as the clamp voltage Vclamp. The constant-voltage circuit 41, a variable resistor RBCL, and fifteen resistors RB are connected in series. The fifteen resistors RB have the same resistances, respectively. A switch circuit 42 in which a plurality of transistors Q3 are connected in the shape of a matrix, is connected to the connection ends of the respective resistors RB and both the ends of a resistor array. The switch circuit 42 is fed with 4-bit high-order row address signals AROW0-AROW3 and /AROW0-/AROW3 as the block address signal BLAD, and it grounds any of the connection ends of the resistors RB in accordance with the high-order row address signals AROW0-AROW3 and /AROW0-/AROW3.

As shown in FIG. 7 by way of example, in a case where the block Block0 nearest to the sense amplifier/data register circuit 21 has been selected, "1111" is inputted as the high-order row addresses AROW0-AROW3, so that the four transistors Q3 at the uppermost stage of the switch circuit 42 are simultaneously brought into ON states, and a voltage corresponding to (IREF×RBCL) is outputted as the clamp voltage Vclamp. This is an example in which the lowest voltage is generated as the clamp voltage Vclamp. On the other hand, in a case where the block Block15 remotest from the sense amplifier/data register circuit 21 has been selected, "0000" is inputted as the high-order row addresses AROW0-AROW3, so that the four transistors Q3 at the lowermost stage of the switch circuit 42 are simultaneously brought into ON states, and a voltage corresponding to (IREF×RBCL+15×RB) is outputted as the clamp voltage Vclamp. This is an example in which the highest voltage is generated as the clamp voltage Vclamp. Incidentally, a circuit for generating the clamp voltage Vclamp2 is quite opposite in logic, and it is so configured that the clamp voltage which is generated when the block Block0 has been selected becomes the highest value, whereas the clamp voltage which is generated when the block Block15 has been selected becomes the lowest value.

According to this embodiment, the different values of the clamp voltage Vclamp are respectively allotted to the sixteen blocks, and hence, the current values of the bit lines BL can be finely controlled.

Figure 8:
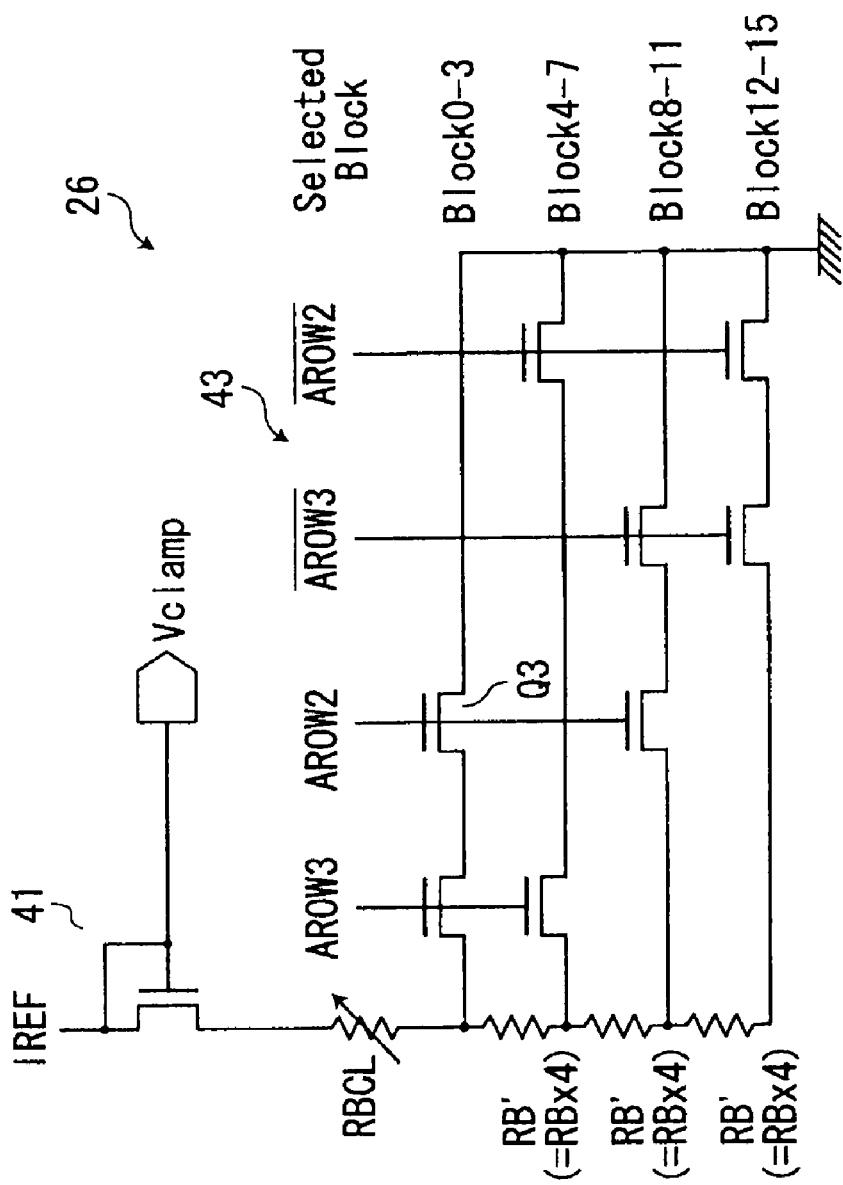
FIG. 8 is a circuit diagram of another example of the Vclamp generation circuit in the memory of the second embodiment.

However, in a case where such a fine current control is unnecessary, a simple Vclamp generation circuit 26 can be configured as shown in FIG. 8 by way of example. In this example, a switch 43 is fed with 2-bit high-order row addresses AROW2 and AROW3, and the clamp voltage Vclamp is switched in four stages in the cases where the blocks Block0-Block3, Block4-Block7, Block8-Block 11, and Block12-Block15 have been selected. Each resistor RB' for use has a resistance value which is four times as large as the resistance value of each resistor RB in the circuit shown in FIG. 6.

This embodiment has the advantage that it can be configured of the simple circuit, though it is inferior to the preceding embodiment in a controllability for canceling the resistance components of the bit lines BL.

Incidentally, in the foregoing embodiments, the clamp voltage Vclamp is linearly changed on the basis of the block addresses, but it can also be nonlinearly changed. In this case, the respective resistance values of resistors for use may be made different, or how to select the resistors by a switch circuit may be made nonlinear.

The sense amplifier for use in each of the embodiments may be either a current detection type or a voltage detection type, but the use of the sense amplifier of the current control type is more advantageous for the reason that a current control is possible.

Besides, although the NAND type flash memory has been exemplified in each of the embodiments, the invention is not restricted to the NAND type flash memory, but it is also applicable to semiconductor memory devices such as NOR type, DINOR (Divided bit line NOR) type and AND type EEPROMs.

What is claimed is:

1. A semiconductor memory device comprising:
    a memory cell array having a plurality of memory cells that are arranged in a shape of a matrix along a plurality of bit lines arranged in parallel and a plurality of word lines intersecting orthogonally to the bit lines;
    a sense amplifier;
    a clamping transistor connected between the sense amplifier and the bit lines and a clamp voltage applied to a gate thereof;
    a clamp voltage generation circuit generating the clamp voltage; and
    wherein the memory cell array is divided into a plurality of blocks in a direction in which the bit lines extend, and the clamp voltage generation circuit determines the clamp voltage on the basis of an address of the block to which the selected memory cell belongs.

2. The semiconductor memory device according to claim 1, wherein the clamp voltage generation circuit generating the clamp voltage so as to become larger as a distance from the sense amplifier to a selected one of the memory cells is longer.

3. The semiconductor memory device according to claim 2, wherein such sense amplifiers and such clamping transistors are distributively arranged in halves, on both sides of the memory cell array in the extending direction of the bit lines.

4. The semiconductor memory device according to claim 3, wherein the clamp voltage generation circuit feeds a first clamp voltage to the clamping transistor on one side of the memory cell array, and it feeds a second clamp voltage to the clamping transistor on another side of the memory cell array.

5. The semiconductor memory device according to claim 1, wherein the clamp voltage generation circuit has a constant-voltage circuit and a plurality of resistors connected in series and a switch circuit.

6. The semiconductor memory device according to claim 5, wherein the switch circuit has a plurality of transistors, and
    a gate of the plurality of transistors is input a part of the address of the block.

7. The semiconductor memory device according to claim 5, wherein the clamp voltage generation circuit decides an end of a resistor in the plurality of resistors applied to grand voltage according to the address of the block.

8. The semiconductor memory device according to claim 6, wherein the clamp voltage generation circuit decides an end of a resistor in the plurality of resistors applied to grand voltage according to the address of the block.

9. The semiconductor memory device according to claim 6, wherein the part of the address of the block is high-order row address.

10. The semiconductor memory device according to claim 5, wherein the switch circuit has a plurality of transistors connecting to an one end of the plurality of resistors, and
    a number of the plurality of transistors is equal to a number of a bit of the address of the block.

11. The semiconductor memory device according to claim 5, wherein the switch circuit has a plurality of transistors connecting to an one end of the plurality of resistors, and
    a number of the plurality of transistors is less than a number of a bit of the address of the block.

* * * * *